US011314359B2

(12) United States Patent
Choi et al.

(10) Patent No.: US 11,314,359 B2
(45) Date of Patent: Apr. 26, 2022

(54) TOUCH SENSING ELECTRODE STRUCTURE AND TOUCH SENSOR INCLUDING THE SAME

(71) Applicant: DONGWOO FINE-CHEM CO., LTD., Jeollabuk-do (KR)

(72) Inventors: Byung Jin Choi, Gyeonggi-do (KR); Sung Jin Noh, Gyeonggi-do (KR); Woo Hyun Bae, Gyeonggi-do (KR); Min Soo Seo, Gyeonggi-do (KR); Cheol Hun Lee, Gyeonggi-do (KR); Eung Goo Cho, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 0 days.

(21) Appl. No.: 15/983,203

(22) Filed: May 18, 2018

(65) Prior Publication Data

US 2018/0335865 A1    Nov. 22, 2018

(30) Foreign Application Priority Data

May 19, 2017 (KR) .................. 10-2017-0062440

(51) Int. Cl.
*G06F 3/044* (2006.01)
*G06F 3/041* (2006.01)
*H01L 27/32* (2006.01)
*H01L 51/00* (2006.01)
*G02F 1/1333* (2006.01)

(52) U.S. Cl.
CPC ............ *G06F 3/0443* (2019.05); *G06F 3/041* (2013.01); *G06F 3/04164* (2019.05); *G02F 1/13338* (2013.01); *G02F 1/133305* (2013.01); *G06F 3/0448* (2019.05); *G06F 2203/04102* (2013.01); *G06F 2203/04112* (2013.01);
(Continued)

(58) Field of Classification Search
CPC combination set(s) only.
See application file for complete search history.

(56) References Cited

U.S. PATENT DOCUMENTS

2004/0239650 A1* 12/2004 Mackey ............... G06F 3/0446
345/174
2011/0102361 A1* 5/2011 Philipp ............... G02F 1/13439
345/174

(Continued)

FOREIGN PATENT DOCUMENTS

CN          105023903 A    11/2015
KR    10-2014-0092366 A     7/2014
(Continued)

OTHER PUBLICATIONS

Office action dated Mar. 29, 2021 from Korean Patent Office in a counterpart Korean Patent Application No. 10-2017-0062440. (all the cited references are listed in this IDS.) (English translation is also submitted herewith.).

*Primary Examiner* — Jose R Soto Lopez
(74) *Attorney, Agent, or Firm* — The PL Law Group, PLLC

(57) ABSTRACT

A touch sensing electrode structure includes sensing electrodes, each of which including a plurality of unit patterns, and traces electrically connected to the sensing electrodes. The traces include at least two trace lines and trace bridges connecting the at least two trace lines to each other. An electrode visibility due to a pattern deviation is reduced and a reliability of the trace is improved by the trace bridge.

12 Claims, 11 Drawing Sheets

(52) U.S. Cl.
CPC ........ *H01L 27/323* (2013.01); *H01L 51/0097* (2013.01); *H01L 2251/5338* (2013.01)

(56) References Cited

U.S. PATENT DOCUMENTS

| | | | | |
|---|---|---|---|---|
| 2014/0204050 A1* | 7/2014 | Huang | .................... | G06F 3/041 345/174 |
| 2014/0225839 A1* | 8/2014 | Dunphy | ................ | G06F 3/0412 345/173 |
| 2014/0292713 A1* | 10/2014 | Koito | .................. | G02F 1/13338 345/174 |
| 2014/0320760 A1* | 10/2014 | Ishizaki | ................ | G06F 3/0445 349/12 |
| 2014/0320769 A1* | 10/2014 | Masuda | ................ | G06F 3/0445 349/12 |
| 2014/0360856 A1* | 12/2014 | Mizumoto | ............ | G06F 3/0446 200/600 |
| 2014/0375903 A1* | 12/2014 | Westhues | .............. | G06F 3/0412 349/12 |
| 2015/0206501 A1* | 7/2015 | Kurasawa | ......... | G02F 1/133512 345/206 |
| 2016/0018928 A1* | 1/2016 | Kurasawa | ............. | G06F 3/0446 345/174 |
| 2016/0092004 A1* | 3/2016 | Yoshiki | ................... | G06F 3/047 345/174 |
| 2016/0098120 A1* | 4/2016 | Miyake | ................. | G06F 3/0412 345/174 |
| 2016/0117016 A1* | 4/2016 | Wu | ........................ | G06F 3/0447 345/174 |
| 2016/0147344 A1* | 5/2016 | Yuan | ..................... | G06F 3/0412 345/173 |
| 2016/0195983 A1* | 7/2016 | Miyake | ................. | G06F 3/0443 345/174 |
| 2016/0202833 A1* | 7/2016 | Kim | ....................... | G06F 3/0443 345/173 |
| 2017/0075456 A1* | 3/2017 | Lai | ........................ | G06F 3/0446 |
| 2017/0110529 A1* | 4/2017 | Zhang | ................. | H01L 51/5253 |
| 2017/0199595 A1* | 7/2017 | Keefer | ................. | G06F 3/0446 |
| 2017/0256599 A1* | 9/2017 | Kim | ...................... | G09G 3/3291 |
| 2017/0344162 A1* | 11/2017 | Lee | ....................... | G06F 3/0446 |
| 2017/0372110 A1* | 12/2017 | Uehara | .............. | G06V 40/1306 |
| 2018/0011601 A1* | 1/2018 | Kurasawa | ........... | G06F 3/04166 |
| 2018/0059837 A1* | 3/2018 | Kim | ..................... | G06F 3/0412 |

FOREIGN PATENT DOCUMENTS

KR    10-1527320 B1    6/2015
KR    10-2016-0007627 A    1/2016

\* cited by examiner

TOUCH SENSING ELECTRODE STRUCTURE AND TOUCH SENSOR INCLUDING THE SAME

CROSS-REFERENCE TO RELATED APPLICATION AND CLAIM OF PRIORITY

This application claims priority to Korean Patent Application No. 10-2017-0062440 filed on May 19, 2017 in the Korean Intellectual Property Office (KIPO), the entire disclosure of which is incorporated by reference herein.

BACKGROUND

1. Field

The present invention relates to a touch sensing electrode structure and a touch sensor comprising the same. More particularly, the present invention relates to a touch sensing electrode structure including a sensing electrode and a trace, and a touch sensor comprising the same.

2. Description of the Related Art

As information technologies are being developed, various demands in display devices having thinner dimension, lightweight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel capable of inputting a user's direction by selecting an instruction displayed on a screen is also developed. The touch panel may be combined with the display device so that display and information input functions may be implemented in one electronic device.

Further, as the display device has become thinner, a flexible display device having a bending or folding property is being developed. Thus, the touch panel having the flexible property is also required to be employed to the flexible display device. For example, improved durability of the touch panel may be needed so that damages and cracks of electrodes or wirings may be prevented when being folded.

If the touch panel is inserted in the display device, an image quality may be degraded when electrode patterns of the touch panel are viewed by the user. Thus, the touch panel having improved durability and flexibility and also having improved optical property is needed.

For example, a touch screen panel including a touch sensor is employed in various image display devices as disclosed in Korean Patent Publication No. 2014-0092366. However, demands for a thin-layered touch sensor or touch panel having improved mechanical and optical properties are continuously increasing.

SUMMARY

According to an aspect of the present invention, there is provided a touch sensing electrode structure having improved optical, electrical and mechanical properties.

According to an aspect of the present invention, there is provided a touch sensor which includes a touch sensing electrode structure having improved optical, electrical and mechanical properties.

According to an aspect of the present invention, there is provided an image display device which includes a touch sensor having improved optical and electrical properties.

The above aspects of the present inventive concepts will be achieved by the following features or constructions:

(1) A touch sensing electrode structure, comprising: sensing electrodes, each of which including a plurality of unit patterns; and traces electrically connected to the sensing electrodes, the trace including at least two trace lines and trace bridges connecting the at least two trace lines to each other.

(2) The touch sensing electrode structure according to the above (1), wherein the trace includes a trace unit pattern having a shape the same as that of the unit pattern included in the sensing electrode.

(3) The touch sensing electrode structure according to the above (2), wherein the unit pattern and the trace unit pattern have a concave polygonal shape.

(4) The touch sensing electrode structure according to the above (2), wherein the unit pattern and the trace unit pattern have a parallelogram shape or a rhombus shape.

(5) The touch sensing electrode structure according to the above (1), further comprising dummy bridges disposed between neighboring ones of the traces.

(6) The touch sensing electrode structure according to the above (5), wherein the traces include a first trace and a second trace neighboring each other, and the dummy bridges are alternately connected to the first trace and the second trace along an extending direction of the trace.

(7) The touch sensing electrode structure according to the above (5), wherein the dummy bridges include an island pattern isolated between the neighboring ones of the traces.

(8) The touch sensing electrode structure according to the above (5), wherein a dummy unit pattern is defined by the dummy bridges and the trace lines adjacent to the dummy bridges (9) The touch sensing electrode structure according to the above (8), wherein the dummy unit pattern has a shape the same as that of the unit pattern included in the sensing electrode except that the dummy unit pattern has a cut portion in at least a portion thereof.

(10) The touch sensing electrode structure according to the above (1), wherein the sensing electrode includes electrode lines having a zigzag line shape and connecting electrodes, the electrode lines being connected to each other by the connecting electrodes.

(11) The touch sensing electrode structure according to the above (10), wherein the trace line and the electrode line have the same shape.

(12) The touch sensing electrode structure according to the above (1), wherein the sensing electrode and the trace include the same transparent conductive oxide or the same metal.

(13) A touch sensor, comprising a substrate layer, and the touch sensing electrode structure according to any one of the above (1) to (12) on the substrate layer.

(14) An image display device including the touch sensor according to the above (13).

In a touch sensing electrode structure or a touch sensor according to exemplary embodiments of the present invention, traces formed in, e.g., a wiring region may include a pattern structure substantially the same as or similar to that of sensing electrodes formed in a sensing region using a trace bridge and/or a dummy bridge. Thus, an electrode visibility and a moire phenomenon due to a deviation of an electrode configuration in the sensing region and the wiring region may be suppressed.

Further, the sensing electrode included in the touch sensing electrode structure may include a plurality of polygonal patterns arranged in a zigzag configuration. Accordingly, a density of unit electrodes in the sensing electrode may be increased to reduce a resistance and improve a touch sensing resolution.

For example, the touch sensor may include the touch sensing electrode structure formed at a single layer or a single level, and may be included in an image display device such as a flexible display device.

DETAILED DESCRIPTION

According to exemplary embodiments of the present invention, a touch sensing electrode structure includes a sensing electrode and a trace structure including a pattern shape substantially the same as or similar to that of the sensing electrode, and the trace structure may include trace lines connected to each other by a trace bridge. Accordingly, the touch sensing electrode structure having reduced electrode visibility and improved durability may be provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Touch Sensing Electrode Structure

Figure 1:
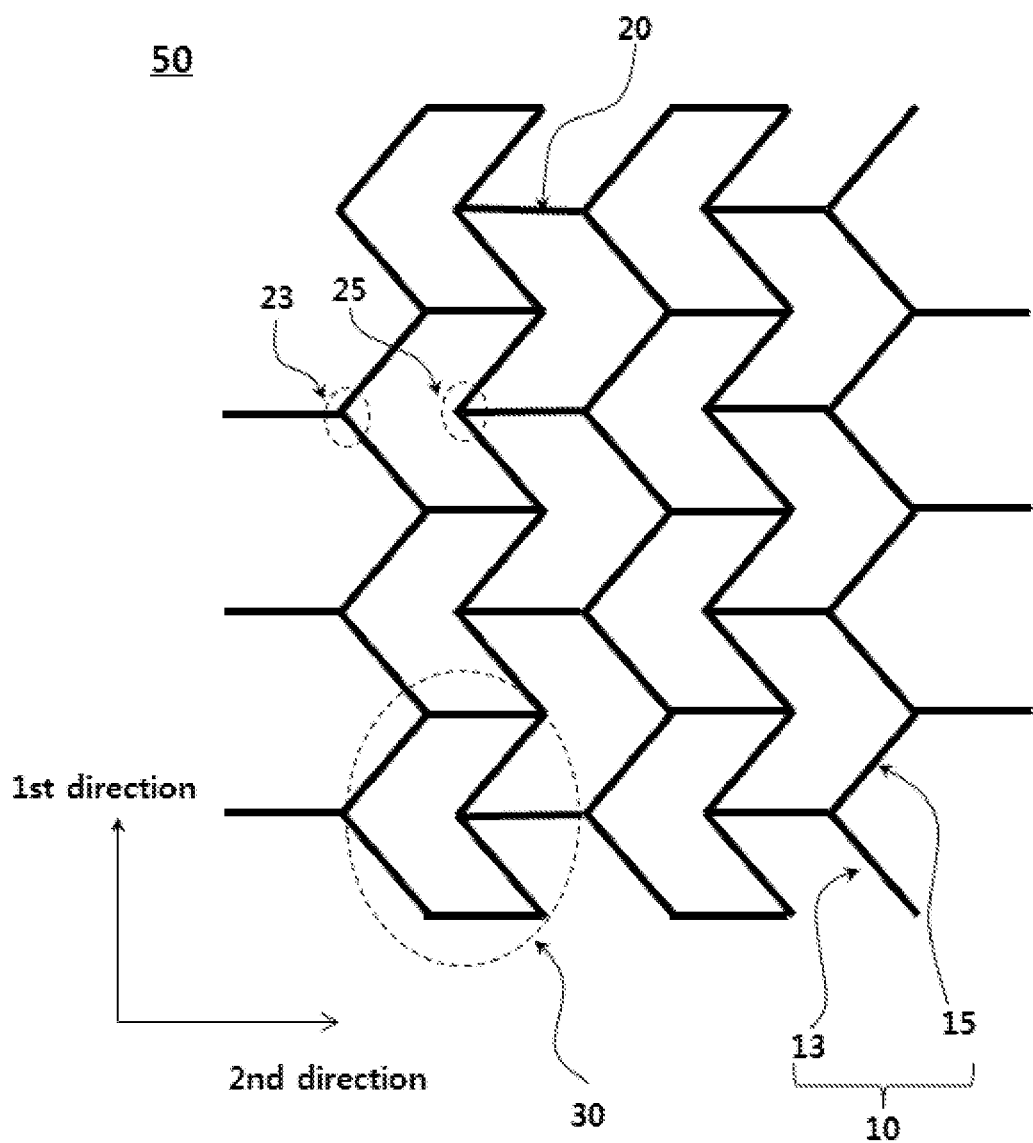
FIGS. 1 and 2 are schematic top plane views illustrating a sensing electrode included in a touch sensing electrode structure in accordance with exemplary embodiments.
Figure 2:
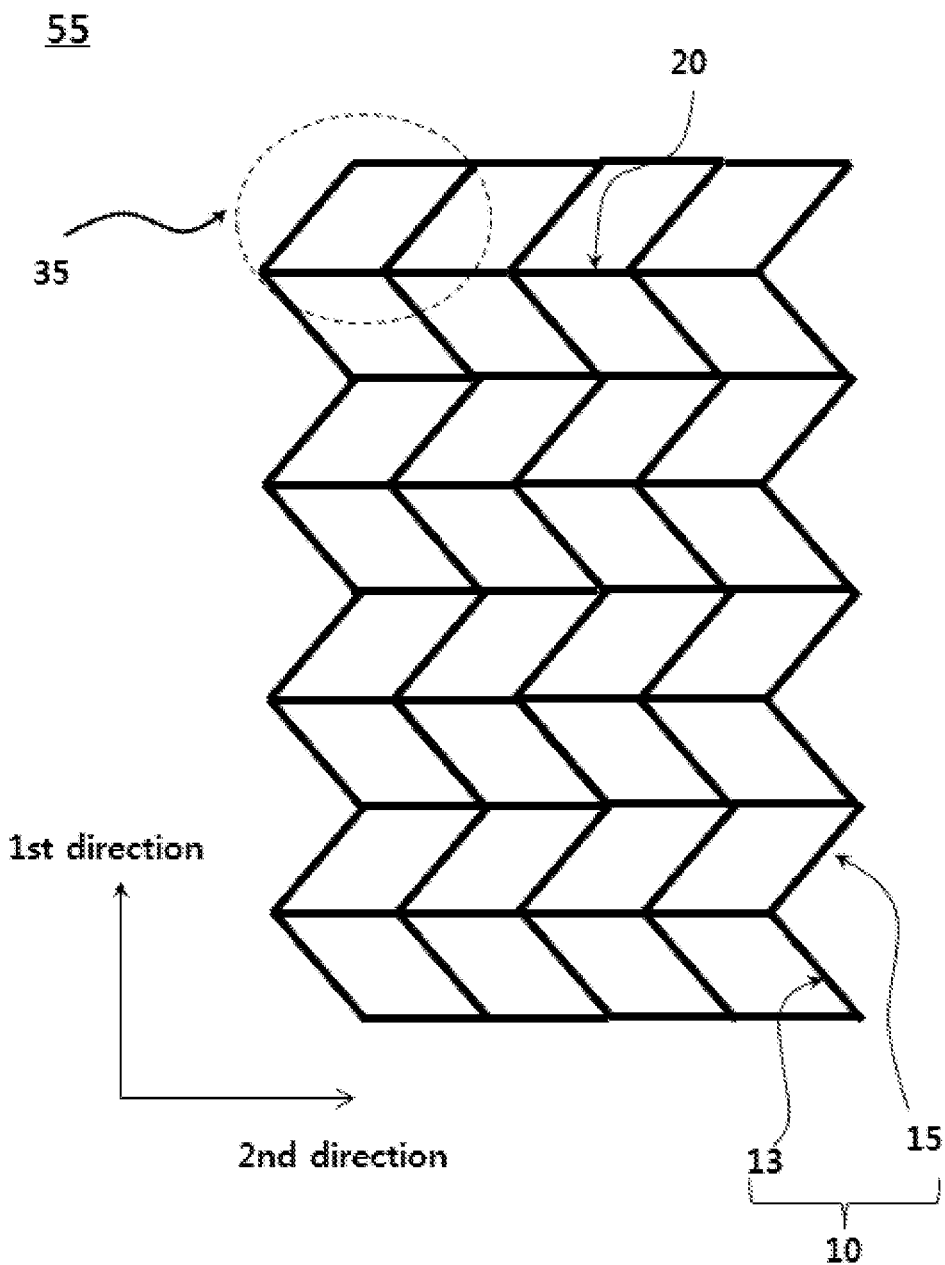

FIGS. 1 and 2 are schematic top plane views illustrating a sensing electrode included in a touch sensing electrode structure in accordance with exemplary embodiments In FIGS. 1 and 2, two directions crossing each other on the same plane are designated as a first direction and a second direction. For example, the first direction and the second direction may be perpendicular to each other. A direction indicated by an arrow and a reverse direction thereto may be regarded as the same direction. The definition of the directions may be the same throughout all drawings included in the present application.

Referring to FIG. 1, a sensing electrode 50 may include a plurality of electrode lines 10. For example, each electrode line 10 may extend in the first direction, and a plurality of the electrode lines 10 may be arranged along the second direction.

The electrode line 10 may include a first electrode pattern 13 and a second electrode pattern 15. Each electrode line 10 may include the first electrode patterns 13 and the second electrode patterns 15 which may be repeatedly and alternately arranged. The first electrode patterns 13 and the second electrode patterns 15 may be continuously and alternately connected to each other.

The first electrode pattern 13 and the second electrode pattern 15 may cross each other with a predetermined angle. Accordingly, the electrode line 10 may have a shape of a polygonal line or a zigzag line including a plurality of inflected portions.

A connecting electrode 20 may be interposed between the neighboring electrode lines 10. In exemplary embodiments, the connecting electrode 20 may have a rod shape or a bar shape extending in the second direction, and two neighboring electrode lines 10 may be physically and electrically connected to each other by the connecting electrode 20.

A unit pattern 30 may be defined by the neighboring first electrode patterns 13, second electrode patterns 15 and connecting electrodes 20. In exemplary embodiments, the unit pattern 30 may be a concave polygonal pattern. A plurality of the concave polygonal patterns may be arranged in a zigzag configuration.

For example, two neighboring unit patterns 30 may share one side in common, and a plurality of the unit patterns 30 may be repeatedly arranged. Accordingly, the sensing electrode 50 may have a mesh structure shape including the unit patterns 30 having the concave polygonal pattern shape.

In some embodiments, the unit pattern 30 may be a concave hexagonal pattern (e.g., having a wedge shape). As illustrated in FIG. 1, the concave hexagonal pattern may be defined by two connecting electrodes 20 neighboring in the first direction, two first patterns 13 neighboring in the second direction, and two second patterns 15 neighboring in the second direction.

The unit pattern 30 may include a convex portion 23 and a concave portion 25 facing in the second direction. For example, the connecting electrode 20 may extend in the second direction such that the convex portion 23 and the concave portion 25 included in the neighboring unit patterns 30 may be connected to each other.

A plurality of the connecting electrodes 20 may be arranged along the first direction to form a connecting electrode column, and a plurality of the connecting electrode columns may be formed along the second direction. The connecting electrodes 20 included in the neighboring connecting electrode columns may partially overlap along the first direction.

As described above, the concave polygonal patterns may be arranged in the zigzag mesh construction by the connecting electrodes 20 so that a density of patterns or electrodes connected to each other in a unit area may be increased while obtaining a desired aperture ratio. Thus, both a transmittance and an electrical property (e.g., a low resistance) may be improved.

The electrode line 10 and the connecting electrode 20 may be formed of the same conductive material. For example, the electrode line 10 and the connecting electrode 20 may include a metal, an alloy, a metal wire, or a transparent conductive oxide.

For example, the electrode line 10 and the connecting electrode 20 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), or an alloy thereof (e.g., silver-palladium-copper (APC)). These may be used alone or in a combination thereof.

The electrode line 10 and the connecting electrode 20 may include the transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the electrode line 10 and the connecting electrode 20 may include a stack structure including the transparent conductive oxide and the metal. For example, the electrode line 10 and the connecting electrode 20 may have a triple-layered structure including a transparent conductive oxide layer-a metal layer-a transparent conductive oxide layer. In this case, a flexible property may be enhanced by the metal layer, and a resistance may be reduced to increase a signal transfer speed. Further, an anti-corrosion property and a transmittance of the sensing electrode 50 may be improved by the transparent conductive oxide layer.

As illustrated in FIG. 1, the sensing electrode 50 may include the mesh structure that may include a plurality of the concave polygonal patterns. The mesh structure may be patterned to a predetermined size and shape to form the sensing electrode 50. FIG. 1 illustrates a portion of the sensing electrode 50, and the patterned shape of the sensing electrode 50 may not be specifically limited.

Referring to FIG. 2, a unit pattern 35 of a sensing electrode 55 may have a parallelogram shape or a rhombus shape. For example, a plurality of the unit patterns 35 may be repeatedly in a zigzag configuration along the first direction while sharing upper and lower sides of a parallelogram in common. Further, a plurality of the unit patterns 35 may be connected and repeated along the second direction while sharing an inclined side of the parallelogram in common.

The unit pattern 35 may be defined by a first electrode pattern 13 and a second electrode pattern 15 included in an electrode line 10, and a connecting electrode 20 connecting the neighboring electrode lines 10. For example, the unit pattern 35 may be defined by a pair of the connecting electrodes 20 neighboring in the first direction and a pair of the electrode patterns neighboring in the second direction.

The touch sensing electrode structure may include the sensing electrode having, e.g., an electrode arrangement or construction as described with reference to FIG. 1 or FIG. 2. Accordingly, a pattern density per unit area may be improved and a desirable aperture ratio may be obtained when the touch sensing electrode structure is applied to an image display device such as a flexible display device. Thus, a high touch sensing resolution may be realized while minimizing a visibility of an electrode or a pattern.

Figure 3:
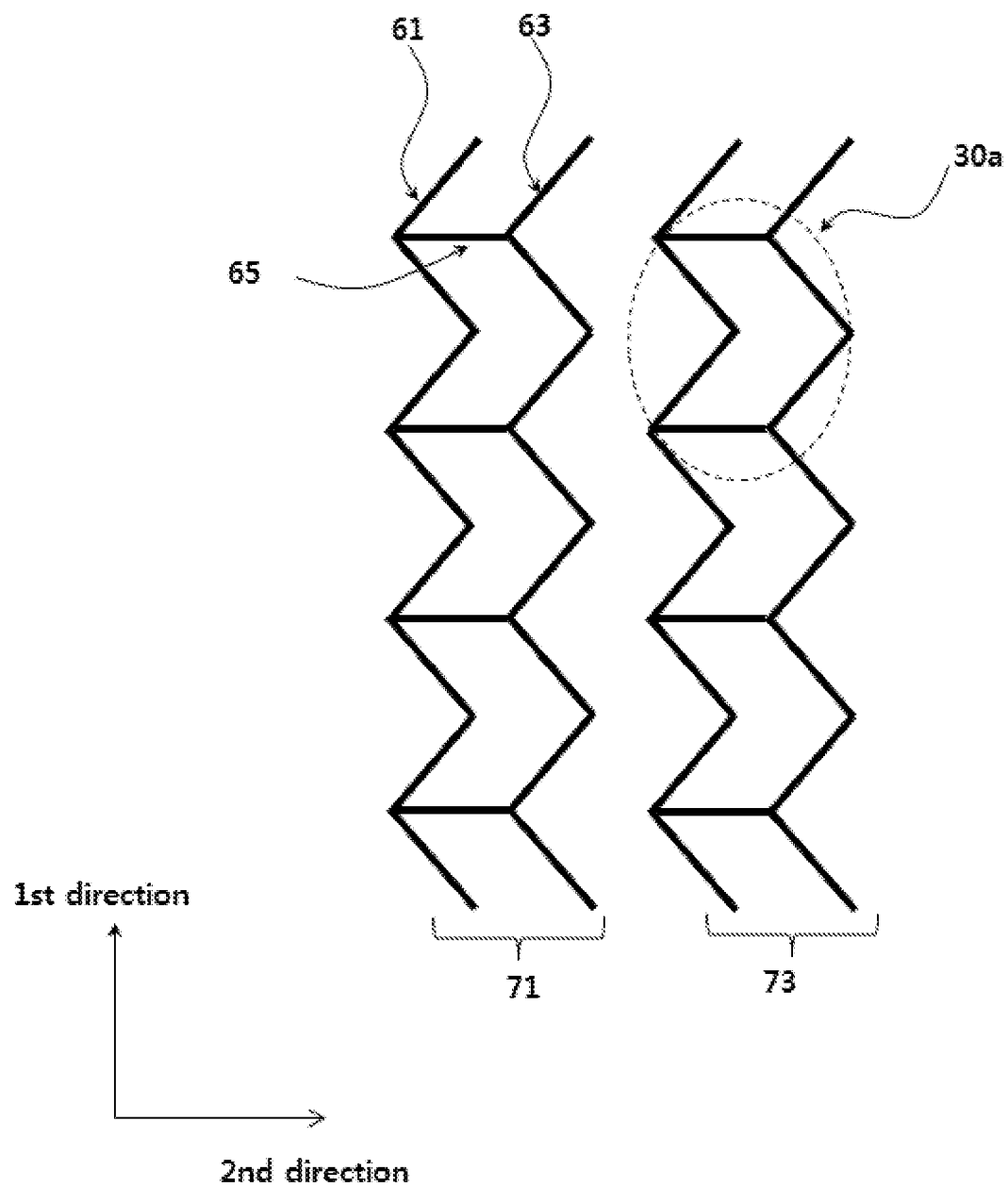
FIGS. 3 and 4 are schematic top plane views illustrating a trace structure included in a touch sensing electrode structure in accordance with exemplary embodiments.
Figure 4:
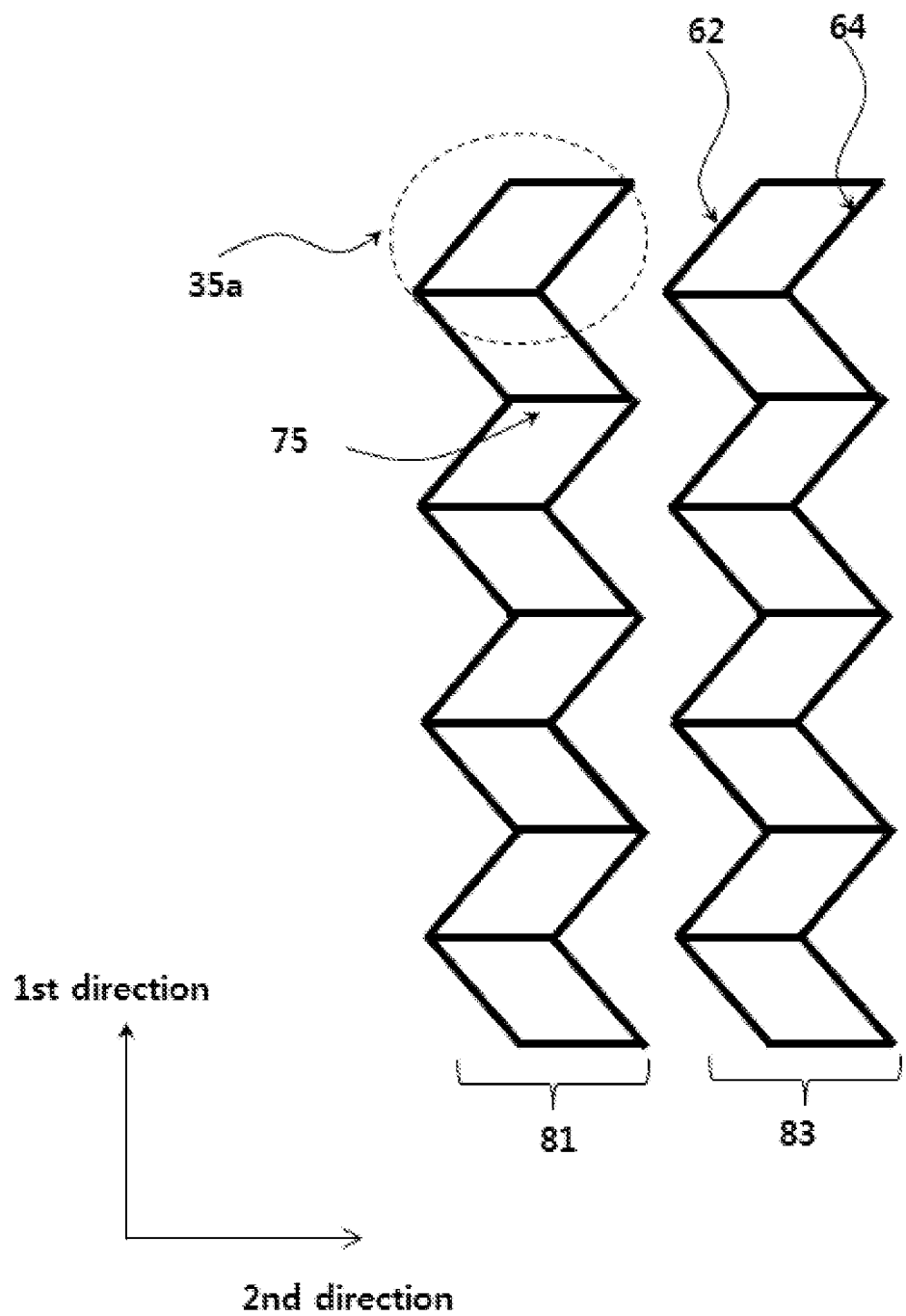

FIGS. 3 and 4 are schematic top plane views illustrating a trace structure included in a touch sensing electrode structure in accordance with exemplary embodiments.

The trace structure may include a trace. For example, the trace structure may include a plurality of the traces arranged in the second direction. Traces neighboring in the second direction are designated as a first trace and a second trace in FIGS. 3 and 4.

Referring to FIG. 3, the trace structure may include a first trace 71 and a second trace 73. In exemplary embodiments, each trace may include at least two trace lines 61 and 63.

The trace line may have a shape or a construction substantially the same as or similar to that of the electrode line 10 illustrated in FIG. 1. In exemplary embodiments, the trace line may have a zigzag line shape or a periodic polygonal line shape extending in the first direction.

In exemplary embodiments, each of the trances 71 and 73 may include a pair of the trace lines or two trace lines neighboring in the second direction, e.g., the first trace line 61 and the second trace line 63.

The first and the second trace lines 61 and 63 in each trace 71 and 73 may be electrically and physically connected to each other by a trace bridge 65. A plurality of the trace bridges 65 may be repeatedly arranged along the first direction such that the first and second trace lines 61 and 63 may be connected to each other.

Each trace 71 and 73 may include a plurality of trace unit patterns 30a. In exemplary embodiments, the trace unit pattern 30a may have a shape substantially the same as or similar to that of the unit pattern included in the sensing electrode electrically connected to the trace.

In some embodiments, the trace unit pattern 30a may have a shape (e.g., a concave hexagonal shape) substantially the same as or similar to that of the unit pattern 30 included in the sensing electrode 50 illustrated in FIG. 1.

The first trace 71 and the second trace 73 may be electrically connected to different sensing electrodes to serve as a transfer path of a touch signal from the sensing electrodes or an input signal from a driving circuit. The first trace 71 and the second trace 73 may be physically and electrically separated from each other.

Referring to FIG. 4, the trace structure may include a first trace 81 and a second trace 83, and each of the traces 81 and 83 may include a first trace line 62 and a second trace line 64. The first trace line 62 and the second trace line 64 may be electrically and physically connected by a trace bridge 75 in each trace 81 and 83.

The trace bridges 75 may be inserted in each trace 81 and 83 to define trace unit patterns 35a.

As described above, the trace unit pattern 35a may have a shape substantially the same as or similar to that of the unit pattern included in the sensing electrode electrically connected to the trace. In some embodiments, the trace unit pattern 35a may have a shape (e.g., a parallelogram shape or a rhombus shape) substantially the same as or similar to that of the unit pattern 35 included in the sensing electrode 55 illustrated in FIG. 2.

As described with reference to FIGS. 3 and 4, the trace connected to each sensing electrode may include a plurality of the trace lines merged by the trace bridge. Thus, electrical resistance of each trace may be decreased without increasing a volume or a cross-section of each trace line. Additionally, even though one trace line is damaged, failure or malfunction of an entire trace may be prevented by another trace line.

Further, the sensing electrode and the trace may be formed to have substantially the same shape so that an electrode visibility and a moire phenomenon due to a pattern shape deviation may be suppressed.

Figure 5:
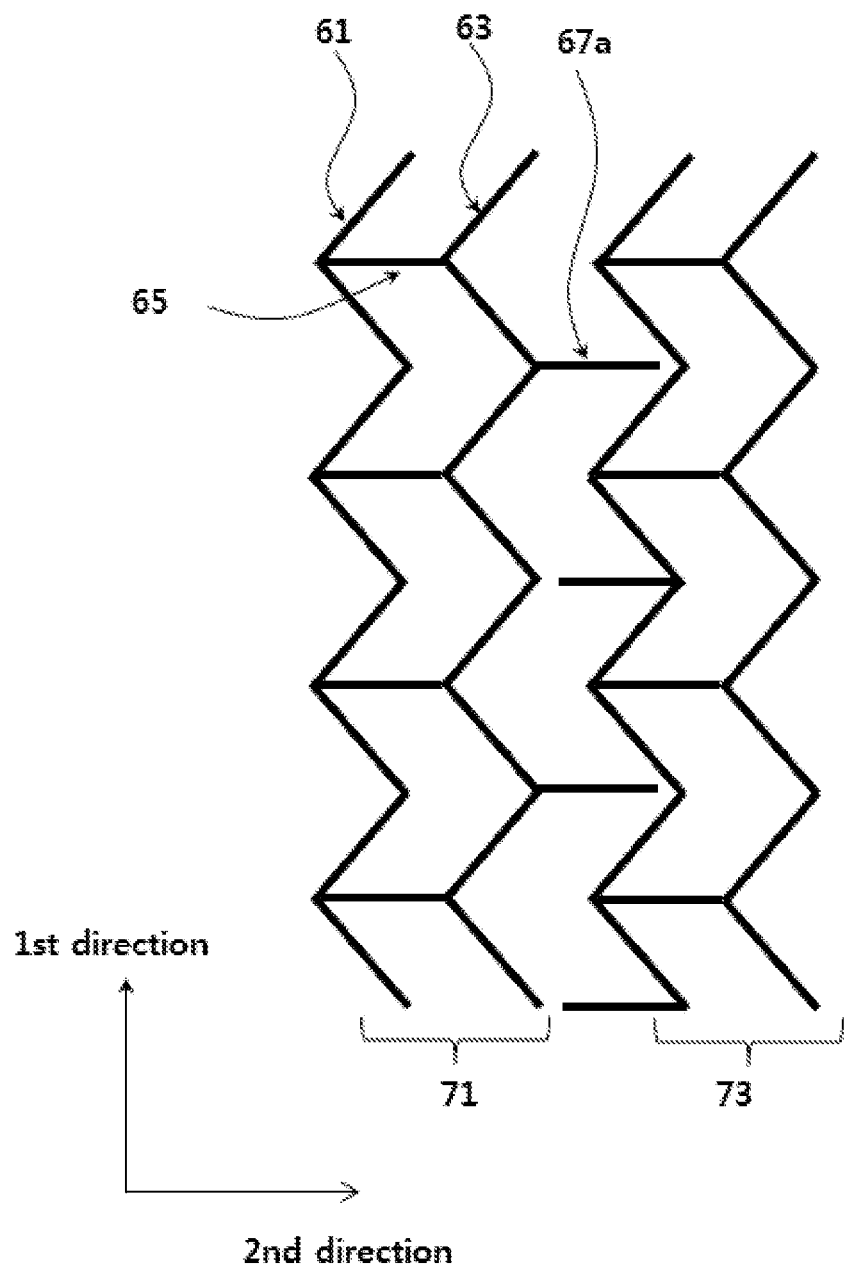
FIGS. 5 and 6 are schematic top plane views illustrating a trace structure in accordance with some exemplary embodiments.
Figure 6:
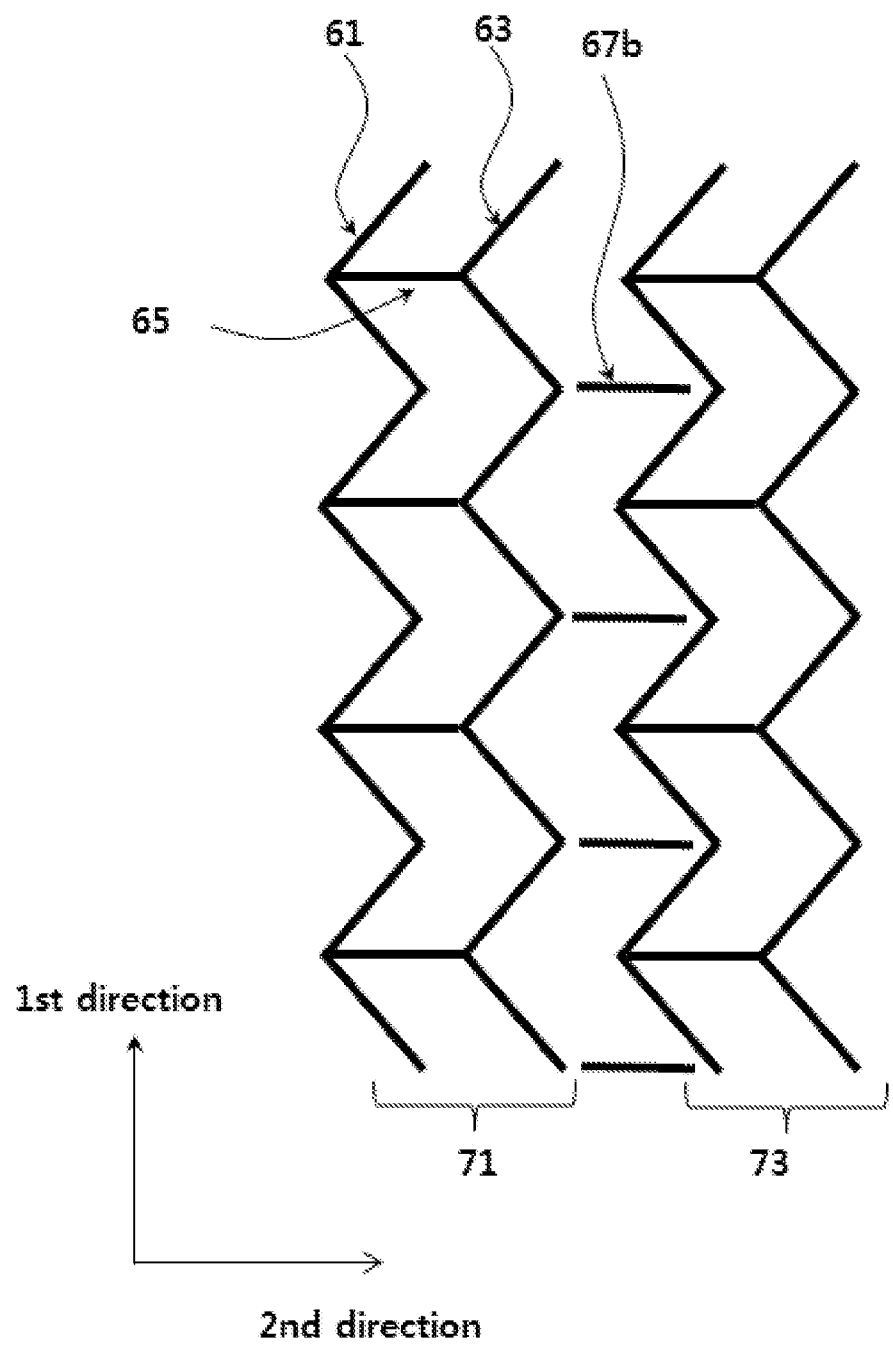

FIGS. 5 and 6 are schematic top plane views illustrating a trace structure in accordance with some exemplary embodiments.

Referring to FIG. 5, the trace structure may further include a dummy bridge 67a.

The trace structure may include traces 71 and 73 having a shape or a construction substantially the same as that illustrated in FIG. 3. Each trace 71 and 73 may include, e.g., first and second trace lines 61 and 63, and trace bridges 65.

In exemplary embodiments, the dummy bridges 67a may be inserted between the neighboring traces 71 and 73. For example, a plurality of the dummy bridges 67a may be repeatedly arranged along the first direction.

The dummy bridges 67a may be arranged in consideration of the pattern shape of the sensing electrode 50 illustrated in FIG. 1. For example, a dummy unit pattern having a substantially concave hexagonal shape may be defined in a region between the first and second traces 71 and 73 by the dummy bridges 67a. The dummy unit pattern may be broken or cut in at least one vertex.

The dummy bridge 67a may be connected to one of the first and second traces 71 and 73. In some embodiments, the dummy bridges 67a may be alternately connected to the first trace 71 and the second trace 73 along the first direction.

The dummy bridges 67a may be alternately connected to the first trace 71 and the second trace 73 so that electrical and mechanical stability of each trace may be uniformly improved.

Referring to FIG. 6, dummy bridges 67b may include island type patterns isolated between the first trace 71 and the second trace 73. In exemplary embodiments, each dummy bridge 67b may extend between the first trace 71 and the second trace 73, and may be physically separated from the first trace 71 and the second trace 73.

Figure 7:
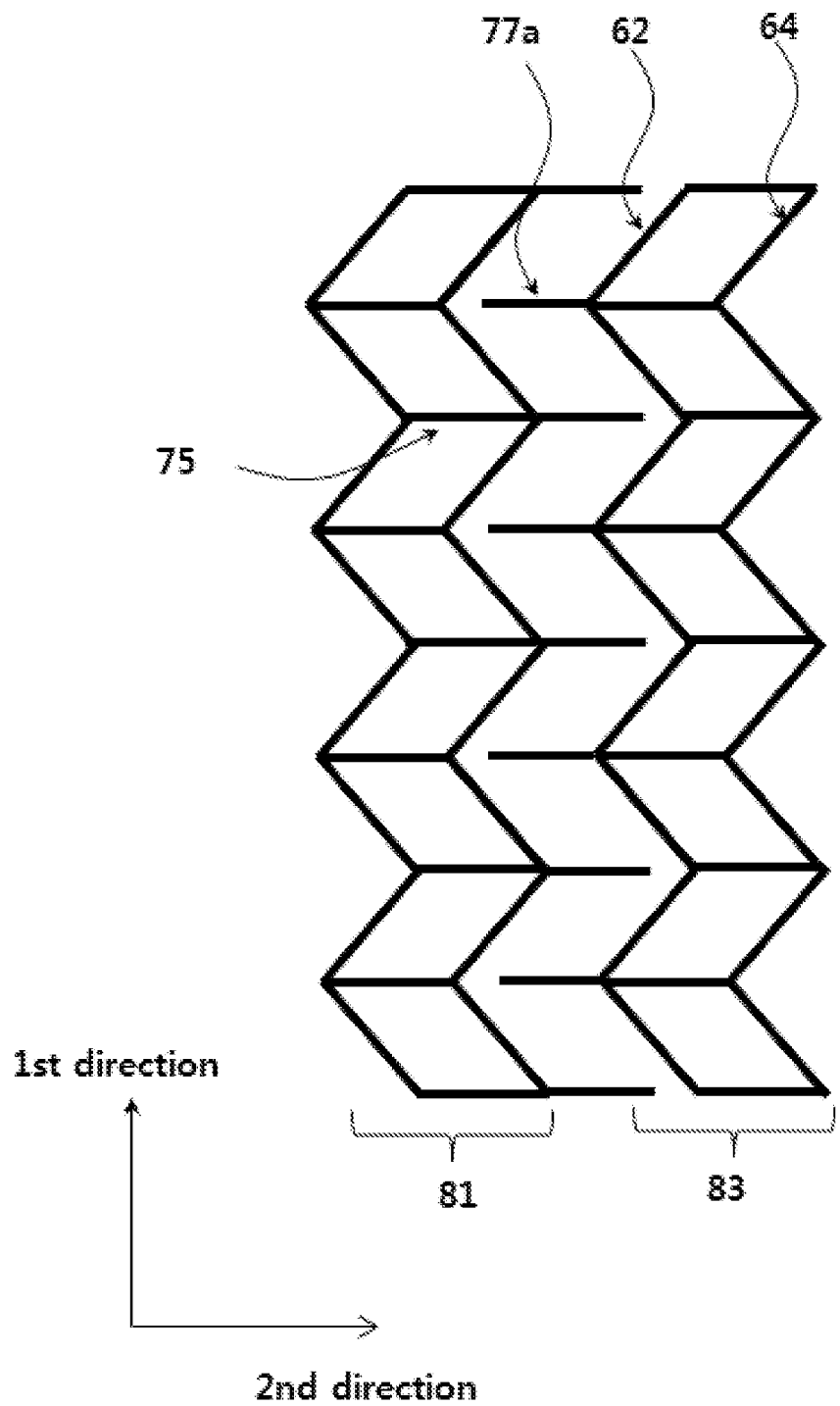
FIGS. 7 and 8 are schematic top plane views illustrating a trace structure in accordance with some exemplary embodiments.
Figure 8:
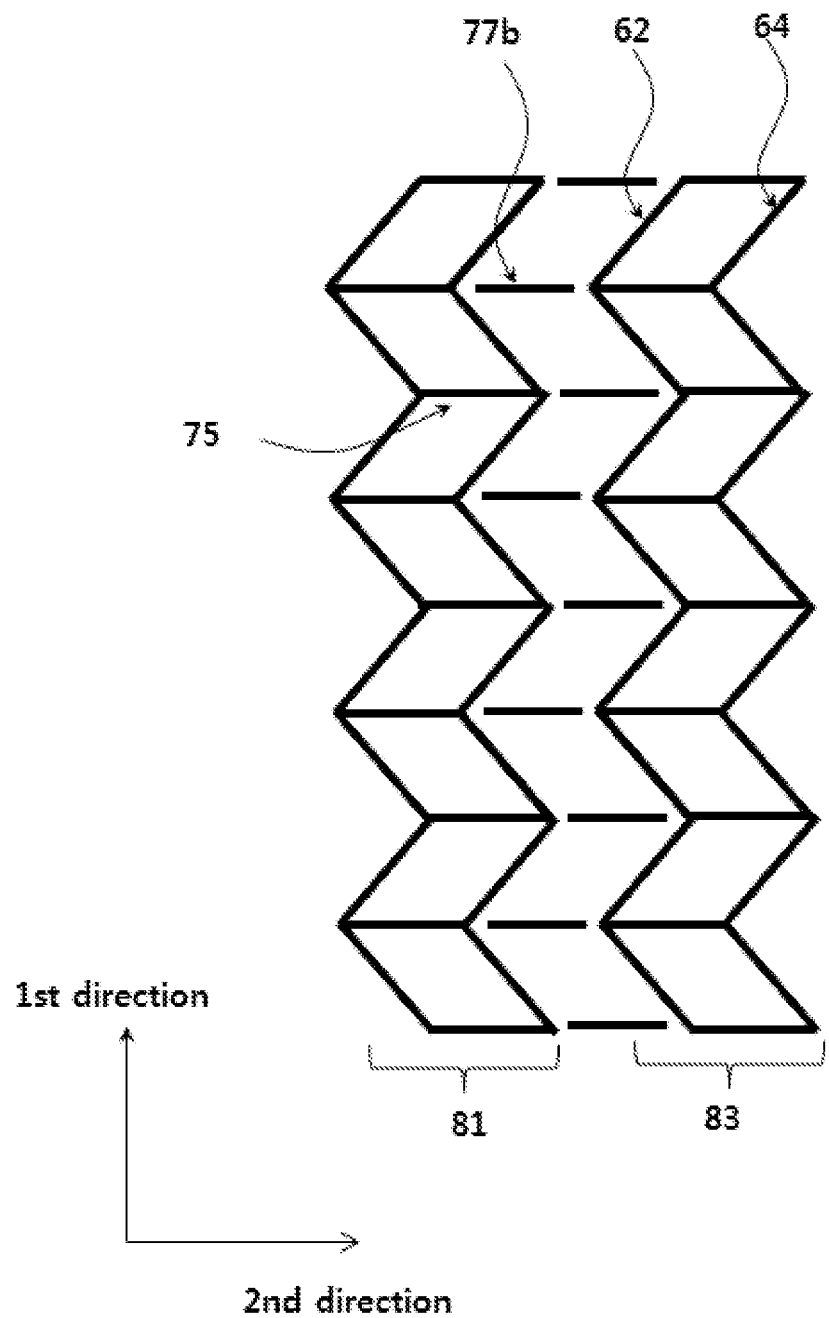

FIGS. 7 and 8 are schematic top plane views illustrating a trace structure in accordance with some exemplary embodiments.

The trace structure may include traces 81 and 83 having a shape and a construction substantially the same as that illustrated in FIG. 4. Each trace 81 and 83 may include, e.g., first and second traces 62 and 64, and trace bridges 75.

In exemplary embodiments, a plurality of the dummy bridges 77a may be repeatedly arranged along the first direction between the neighboring traces 81 and 83.

The dummy bridges 77a may be arranged in consideration of a pattern shape of the sensing electrode 55 illustrated in FIG. 2. For example, a dummy unit pattern having a substantially parallelogram or rhombus shape may be defined in a region between the first and second traces 81 and 83 by the dummy bridges 67a. The dummy unit pattern may be broken or cut in at least one vertex.

In some embodiments, the dummy bridges 77a may be alternately and repeatedly connected to the first trace 81 and the second trace 83 along the first direction.

Referring to FIG. 8, a dummy bridge 77b may be an island type pattern present in a region between the first trace 81 and the second trace 83.

The trace structures described with reference to FIGS. 3 to 8 may include a material substantially the same as that of the sensing electrodes described with reference to FIGS. 1 and 2. Additionally, the trace structure and the sensing electrode may be formed by the substantially the same etching or patterning process.

Figure 9:
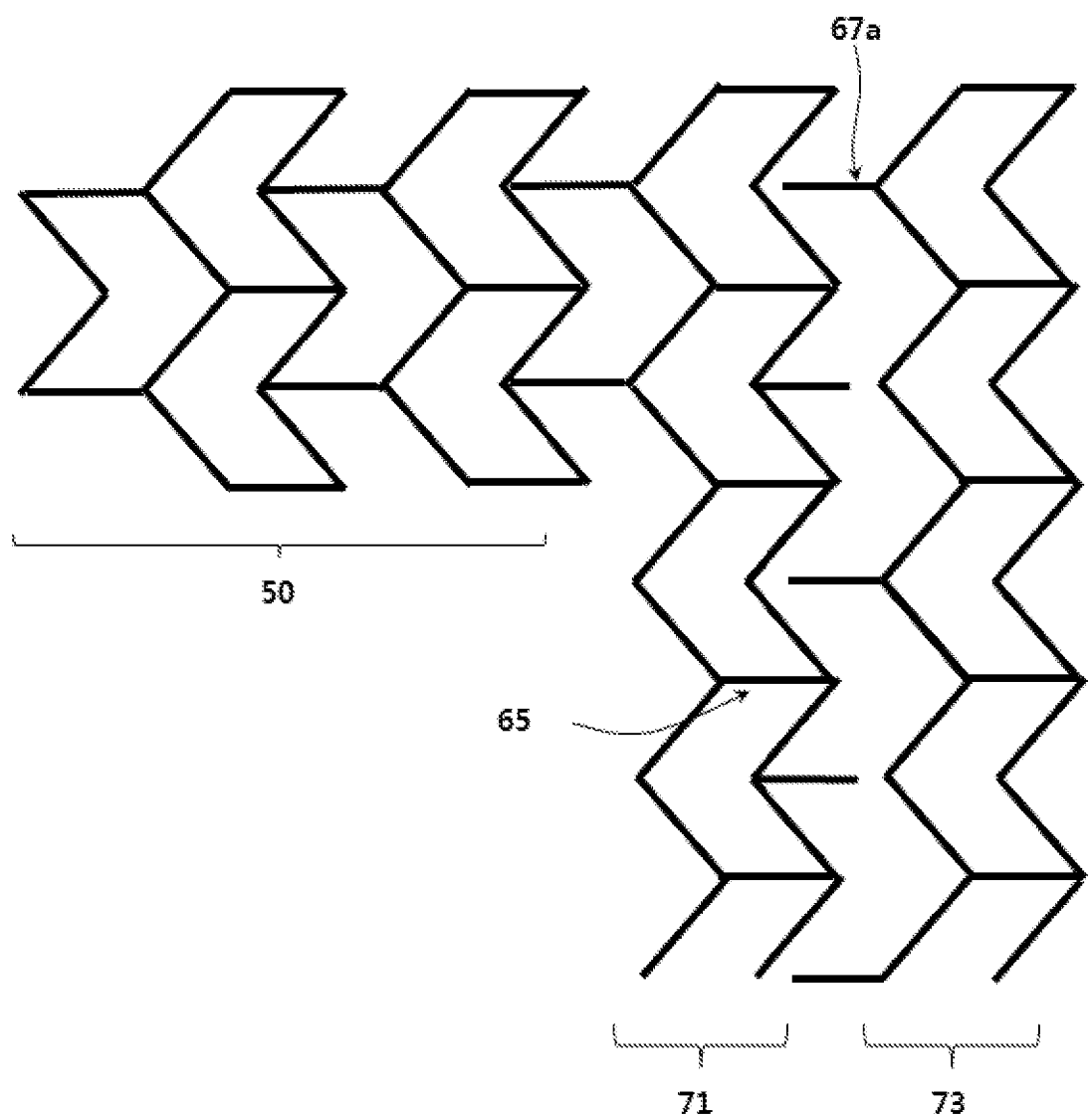
FIGS. 9 and 10 are schematic top plane views illustrating a trace structure in accordance with some exemplary embodiments.
Figure 10:
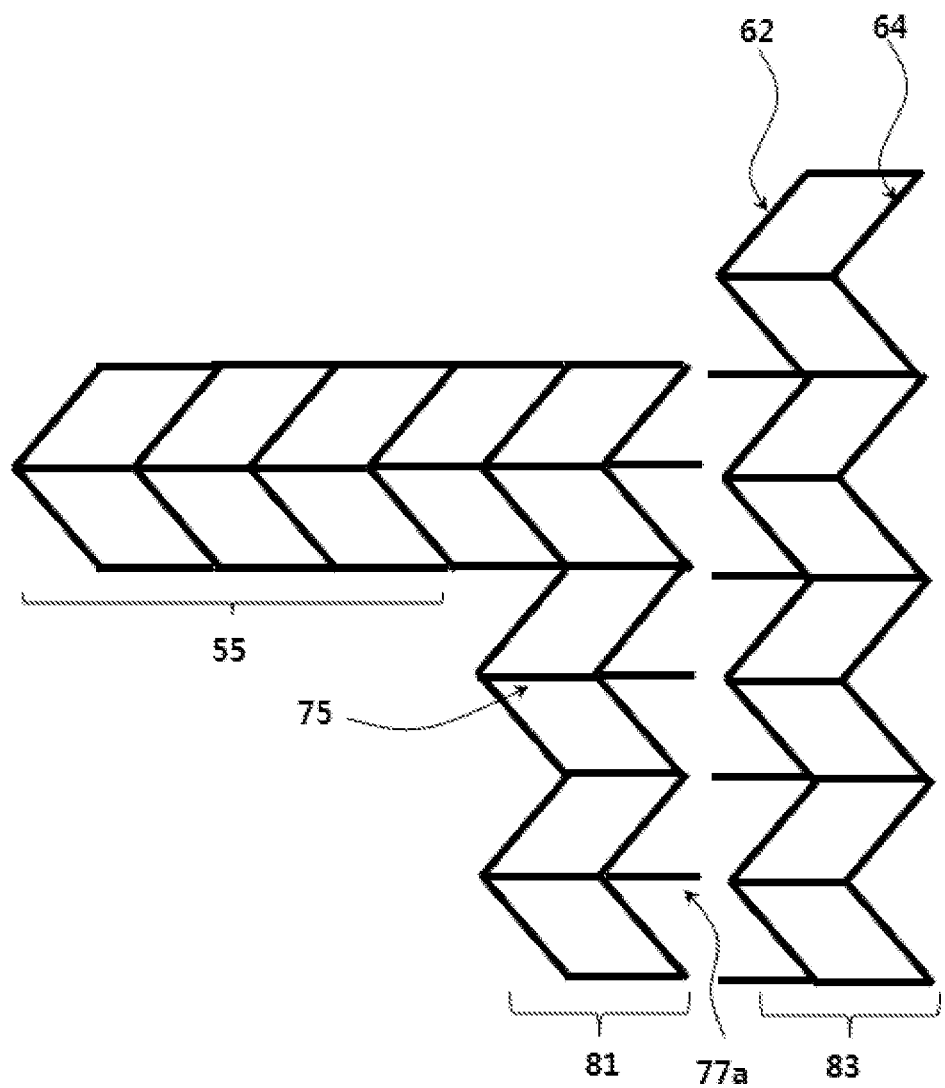

FIGS. 9 and 10 are schematic top plane views illustrating a trace structure in accordance with some exemplary embodiments.

Referring to FIG. 9, the touch sensing electrode structure may include the sensing electrodes 50, and the traces 71 and 73 that may be connected to the sensing electrode 50 and diverged therefrom. For example, the first trace 71 and the second trace 73 may each be connected to different ones of the sensing electrodes 50, If the sensing electrode 50 may include a concave hexagonal unit pattern as described with reference to FIG. 1, the traces 71 and 73 may also include a concave hexagonal trace unit pattern by the trace bridge 65.

In some embodiments, the dummy bridge 67a may be disposed between the traces 71 and 73. Accordingly, a similarity of a trace structure to the sensing electrode 50 may be further enhanced.

Referring to FIG. 10, the sensing electrode 55 of the touch sensing electrode structure may include unit patterns having a substantially parallelogram or rhombus shape as described with reference to FIG. 2. In this case, the traces 81 and 83 diverged from each sensing electrode 55 may also include trace unit patterns having a substantially parallelogram or rhombus shape by the trace lines 62 and 64, and the trace bridge 75.

In some embodiments, the dummy bridge 77a may be included between the traces 81 and 83. Accordingly, the similarity of the trace structure to the sensing electrode 55 may be further enhanced.

FIGS. 9 and 10 may illustrate only a portion of the sensing electrodes 50 and 55, and the unit patterns may be assembled such that the sensing electrodes 50 and 55 may have, e.g., a substantially polygonal shape such as a diamond shape.

Touch Sensor and Image Display Device

Figure 11:
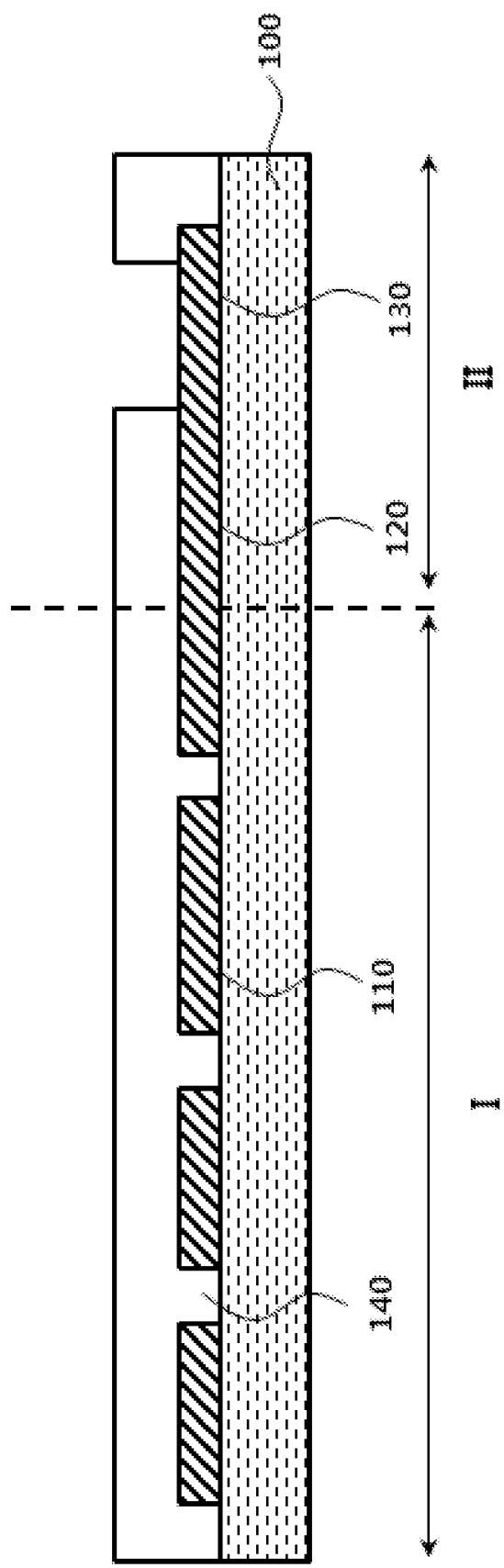
FIG. 11 is a schematic cross-sectional view illustrating a touch sensor in accordance with exemplary embodiments.

FIG. 11 is a schematic cross-sectional view illustrating a touch sensor in accordance with exemplary embodiments.

Referring to FIG. 11, the touch sensor may include a substrate layer 100 and a touch sensing electrode structure on the substrate layer 100. The touch sensing electrode structure may include a sensing electrode 110 and a trace 120.

The touch sensor may include a first region I and a second region II. The first region I may be a sensing region for implementing a touch input sensing. The second region II may be a trace region or a wiring region.

The substrate layer 100 may include a film substrate that may serve as a base layer for forming the touch sensing electrode structure. For example, the substrate layer 100 may include a substrate or a film material commonly used in the touch sensor, e.g., glass, polymer and/or an inorganic insulation material. The polymer may include, e.g., cyclo olefin polymer (COP), polyethylene terephthalate (PET), polyacrylate (PAR), polyether imide (PEI), polyethylene naphthalate (PEN), polyphenylene sulfide (PPS), polyallylate (polyallylate), polyimide (PI), cellulose acetate propionate (CAP), polyether sulfone (PES), cellulose triacetate (TAC), polycarbonate (PC), cyclo olefin copolymer (COC), polymethylmethacrylate (PMMA), etc. The inorganic insulation material may include, e.g., silicon oxide, silicon nitride, silicon oxynitride, a metal oxide, etc.

The sensing electrodes 110 may be disposed on the substrate layer 100 of the first region I. For example, the sensing electrode 110 may have a construction as described with reference to FIG. 1 or FIG. 2. For example, the sensing electrode 110 may include a mesh structure in which polygonal unit patterns may be assembled.

The trace 120 may be disposed on the substrate layer 100 of the second region II. The trace 120 may be diverged from each one sensing electrode 110 to extend on the second region II.

As described with reference to FIGS. 3 to 8, at least two trace lines may be connected by trace bridges to form the trace 120. In some embodiments, dummy bridges may be inserted between the neighboring traces.

A passivation layer 140 may be formed on the substrate layer 100 to cover the sensing electrodes 110. The passivation layer 140 may be also formed on the second region II to at least partially cover the trace 120.

In some embodiments, a portion of the passivation layer 140 formed on the second region II may be partially removed such that a portion of the trace 120 may be exposed. The exposed portion of the trace 120 may serve as a pad portion 130 connected to an external circuit member such as a flexible printed circuit board (FPCB).

The passivation layer 140 may be formed of an inorganic insulation material such as silicon oxide, silicon nitride, etc., or an organic insulation material such as an acryl-based resin, a siloxane-based resin, etc.

FIG. 11 illustrates that the sensing electrode 110 and the trace 120 have a single-layered structure. However, the sensing electrode 110 and the trace 120 may have a multi-layered structure. For example, the sensing electrode 110 and the trace 120 may include a stack structure of a transparent conductive oxide layer-a metal layer-a transparent conductive oxide layer.

In exemplary embodiments, the touch sensor may be a self-capacitance type sensor. In this case, the sensing electrodes 110 may be arranged at a single level, and the trace 120 may be individually connected to each sensing electrode 110.

In some embodiments, the touch sensor may be a mutual-capacitance type sensor. In this case, the sensing electrode 110 may include first electrodes and second electrodes arranged along two crossing directions. Further, a bridge electrode for connecting neighboring ones of the first sensing electrodes while insulating the first electrodes from the second electrodes may be included. An insulation pattern on which the bridge electrode may be disposed may be further formed.

According to exemplary embodiments, an image display device including the touch sensor of FIG. 11 is provided.

The image display device may include a display panel which may include a panel substrate, a pixel circuit including a thin film transistor (TFT) on the panel substrate, and a pixel unit connected to the pixel circuit. In exemplary embodiments, the touch sensor may be disposed on the display panel, and a window substrate may be stacked on the touch sensor.

The pixel unit may include a liquid crystal layer for implementing a liquid crystal display (LCD) or an organic emitting layer for implementing an organic light emitting diode (OLED) display.

If the panel substrate may include a flexible material such as polyimide, the image display device may serve as a flexible display. As described above, the touch sensor according to exemplary embodiments may have improved mechanical stability and optical property so that a stable sensing operation may be provided while being folded or bent.

A functional layer such as a polarizer, a polarizing plate, a retardation film, etc., for improving optical property and transmittance of the image display device may be further included between the display panel and the touch sensor or on the touch sensor.

What is claimed is:

1. A touch sensing electrode structure, comprising:
    sensing electrodes, each of which including a plurality of unit patterns; and
    traces electrically connected to the sensing electrodes, the trace including:
        at least two trace lines; and
        trace bridges connecting the at least two trace lines to each other; and
    dummy bridges disposed between neighboring ones of the traces,
    wherein each of the sensing electrodes include electrode lines and connecting electrodes connecting the electrode lines to each other, the electrode lines extend in a column direction and a plurality of the electrode lines are arranged along a row direction that is perpendicular to the column direction in each of the sensing electrodes;
    the number of the electrode lines neighboring in the row direction in each of the sensing electrode is greater than the number of the trace lines connected to each of the sensing electrode;
    the electrode lines and the trace lines have a zigzag line shape extending in the column direction including inflected portions, and the connecting electrodes and the trace bridges are formed at the inflected portions; and
    the dummy bridges extend only in the row direction between the inflected portions facing only in the row direction of the trace lines included in the neighboring ones of the traces, the dummy bridges are positioned on an imaginary line between inflected points of the inflected portions neighboring each other, and the dummy bridges are physically and electrically separated from at least one of the inflected portions.

2. The touch sensing electrode structure according to claim 1, wherein the trace includes a trace unit pattern having a shape the same as that of the unit pattern included in the sensing electrode.

3. The touch sensing electrode structure according to claim 2, wherein the unit pattern and the trace unit pattern have a concave polygonal shape.

4. The touch sensing electrode structure according to claim 2, wherein the unit pattern and the trace unit pattern have a parallelogram shape or a rhombus shape.

5. The touch sensing electrode structure according to claim 1, wherein the traces include a first trace and a second trace neighboring each other, and
    the dummy bridges are alternately connected to the first trace and the second trace along an extending direction of the trace.

6. The touch sensing electrode structure according to claim 1, wherein the dummy bridges include an island pattern isolated between the neighboring ones of the traces.

7. The touch sensing electrode structure according to claim 1, wherein a dummy unit pattern is defined by the dummy bridges and the trace lines adjacent to the dummy bridges.

8. The touch sensing electrode structure according to claim 7, wherein the dummy unit pattern has a shape the same as that of the unit pattern included in the sensing electrode except that the dummy unit pattern has a cut portion in at least a portion thereof.

9. The touch sensing electrode structure according to claim 1, wherein the trace line and the electrode line have the same shape.

10. The touch sensing electrode structure according to claim 1, wherein the sensing electrode and the trace include the same transparent conductive oxide or the same metal.

11. A touch sensor, comprising:
    a substrate layer; and
    the touch sensing electrode structure of claim 1 on the substrate layer.

12. An image display device including the touch sensor of claim 11.

* * * * *